United States Patent [19]
Nemirovsky

[11] Patent Number: 5,608,208
[45] Date of Patent: Mar. 4, 1997

[54] SINGLE LAYER PLANAR HGCDTE PHOTOVOLTAIC INFRARED DETECTOR WITH HETEROSTRUCTURE PASSIVATION AND P-ON-N HOMOJUNCTION

[75] Inventor: Yael Nemirovsky, Haifa, Israel

[73] Assignee: Technion Research & Development Foundation Ltd., Haifa, Israel

[21] Appl. No.: 377,603

[22] Filed: Jan. 25, 1995

[30] Foreign Application Priority Data

Feb. 8, 1994 [IL] Israel .................................. 108589

[51] Int. Cl.⁶ .................................................. H01J 40/14
[52] U.S. Cl. ................................. 250/214.1; 257/448
[58] Field of Search ......................... 250/214.1, 214 R, 250/338.1, 338.4; 257/443, 448

[56] References Cited

U.S. PATENT DOCUMENTS

| | | | |
|---|---|---|---|
| 4,105,478 | 8/1978 | Johnson . | |
| 4,137,544 | 1/1979 | Koehler . | |
| 4,885,619 | 12/1989 | Kosai | 357/24 |
| 4,956,304 | 9/1990 | Cockrum et al. | 437/5 |
| 4,970,567 | 11/1990 | Ahlgren et al. | 357/30 |
| 5,192,695 | 3/1993 | Wang et al. | 437/5 |
| 5,327,005 | 7/1994 | Granneman | 257/443 |
| 5,380,669 | 1/1995 | Norton | 437/5 |
| 5,432,374 | 7/1995 | Norton | 257/442 |

Primary Examiner—Stephone Allen
Attorney, Agent, or Firm—Edward Langer

[57] ABSTRACT

A method for producing a photodiode with a simplified planar device architecture based on a single layer of HgCdTe using a mature, established growth technology for the sensing material, combined with an implanted homojunction which is at least partially activated during MOCVD CdTe passivation. The device architecture is based on a planar structure, a p-on-n homojunction for sensing the infrared radiation, and a CdTe or CdZnTe/HgCdTe heterostructure for passivation. The MOCVD CdTe passivation can be applied ex-situ, irrespective of the growth technology of the sensing material, and the homojunction is at least partially activated while applying the CdTe passivation. Thus, a major simplification in device architecture is achieved, based on a single layer in contrast to known, double layer heterostructures. Further, the inventive method allows application of different growth technologies for the sensing material and the passivation layer, allowing the sensing material to be supplied via the best available production techniques. Careful control of the interface properties between the passivation layer and the sensing material can be achieved. The method features a reduction in the number of production steps, and includes high-quality passivation. The production process is simplified, and features reduced cost, increased uniformity, yield, reproducibility, and high performance.

7 Claims, 4 Drawing Sheets

५,६०८,२०८

SINGLE LAYER PLANAR HGCDTE PHOTOVOLTAIC INFRARED DETECTOR WITH HETEROSTRUCTURE PASSIVATION AND P-ON-N HOMOJUNCTION

FIELD OF THE INVENTION

The present invention relates to photodiode detectors for scanning and staring advanced infrared focal plane arrays, and more particularly, to a novel, simplified, and low-cost device architecture for high performance photodiode detectors featuring single layer n-type HgCdTe, obtained with a particular growth technology, combined with an implanted homojunction which is partially activated during MOCVD (metal organic chemical vapor deposition) CdTe passivation.

BACKGROUND OF THE INVENTION

The existing technology is well-developed in the production of infrared photodiode detectors based on HgCdTe as the sensing material, and a discussion of the requirements for infrared scanning and staring focal plane arrays is contained in the paper by Balcerak, et al., "Mercury cadmium telluride material requirements for infrared systems", J. Vac. Sci Techn. (Aug. 1992), and the paper by Tennant et al., "Key issues in HgCdTe-based focal plane arrays: An industry perspective", J. Vac. Sci Techn. (Aug. 1992).

In addition, the present state-of-the-art is indicated in the paper by Schoolar et al., "Investigation of the generation-recombination currents in HgCdTe midwavelength infrared photodiodes", J. Vac. Sct Techn. (Aug. 1992), and the paper by Arias, et al., "MBE HgCdTe Heterostructure p-on-n planar infrared photodiodes", J. Electronic Materials. Vol. 22, No. 8 (1993). Additional relevant references appear in annual proceedings of the "U.S. Workshop on the physics and chemistry of HgCdTe and other IR materials", published until 1992 in the Journal of Vac. Sci. Techn., and after that, in the Journal of Electronic Materials. All these references indicate that the state-of-the-art is based on double layer HgCdTe heterostructures, either in planar or mesa configurations.

The double layer $Hg_{1-y}Cd_yTe/Hg_{1-x}Cd_xTe$ (x<y) heterostructures include two layers of HgCdTe with different compositions, and a CdTe passivation which is problematic in production, as indicated by the above-mentioned references. These heterostructures are technologically complex and costly to fabricate. The currently used CdTe passivation is problematic due to the complex double heterostructures, such as are shown in the prior art illustration of FIG. 1 herein. In particular, the mesa structure further complicates the problems encountered during deposition of the CdTe passivation.

Therefore, it would be desirable to produce a photodiode with a simplified device architecture which benefits from application of the best growth technology for the sensing material, and application of the best growth technology for passivation, without limiting the sensing material to a specific technology, to achieve the requirements of large-scale production.

SUMMARY OF THE INVENTION

Accordingly, it is a principal object of the present invention to overcome the drawbacks associated with prior art production techniques, and provide a photodiode with a simplified planar device architecture based on a single layer of HgCdTe using a mature, established growth technology for the sensing material, combined with an implanted homojunction which is at least partially activated during MOCVD CdTe passivation.

In accordance with a preferred method of the invention, there is provided a method for producing a planar photodiode responsive to infrared radiation, said method comprising the steps of:

providing an n-type HgCdTe layer with a predetermined composition and predetermined electrical properties for sensing infrared radiation;

performing ion implantation of arsenic on a portion of said n-type HgCdTe layer to form an arsenic-rich layer;

growing an MOCVD CdTe passivation layer with appropriate interface properties on said n-type HgCdTe layer and said implanted arsenic-rich layer, wherein said growing step includes a pre-treatment step to control said interface properties and cause at least partial activation of said arsenic-rich layer to form a p-on-n homojunction;

annealing said n-type HgCdTe layer and said implanted arsenic-rich layer;

providing openings in said CdTe passivation layer for connection of ohmic contacts to said implanted p-type arsenic layer, and to said n-type HgCdTe layer;

performing metallization of said ohmic contacts; and coating the photodiode with an anti-reflection coating.

The present invention is based on a planar structure, a p-on-n homojunction for sensing the infrared radiation, and a CdTe or CdZnTe/HgCdTe heterostructure for passivation. The MOCVD CdTe passivation can be applied ex-situ, irrespective of the growth technology of the sensing material, and the homojunction is at least partially activated while applying the CdTe passivation.

The inventive structure is not only a major simplification in device architecture, in that it is based on a single layer in contrast to known, double layer heterostructures, but in addition, it is based on use of homojunctions for sensing the infrared radiation and heterostructures for passivation. This combination best integrates the benefits of each structure.

Furthermore, the inventive method allows application of different growth technologies for the sensing material and the passivation layer. This allows the sensing material to be supplied via the best available production techniques. The inventive method also allows careful control of the interface properties between the passivation layer and the sensing material, while simultaneously at least partially activating the implanted arsenic-doped layer during passivation.

The inventive method reduces the number of required production steps, and includes high-quality passivation. Therefore, the production process is simplified, and can be achieved at reduced cost with increased uniformity, yield, and reproducibiiity, while retaining high performance.

Other features and advantages of the invention will become apparent from the following drawings and description.

BRIEF DESCRIPTION OF THE DRAWINGS

For a better understanding of the invention with regard to the embodiments thereof, reference is made to the accompanying drawings, in which like numerals designate corresponding elements or sections throughout, and in which.

DETAILED DESCRIPTION OF THE PREFERRED EMBODIMENTS

Figure 1A:
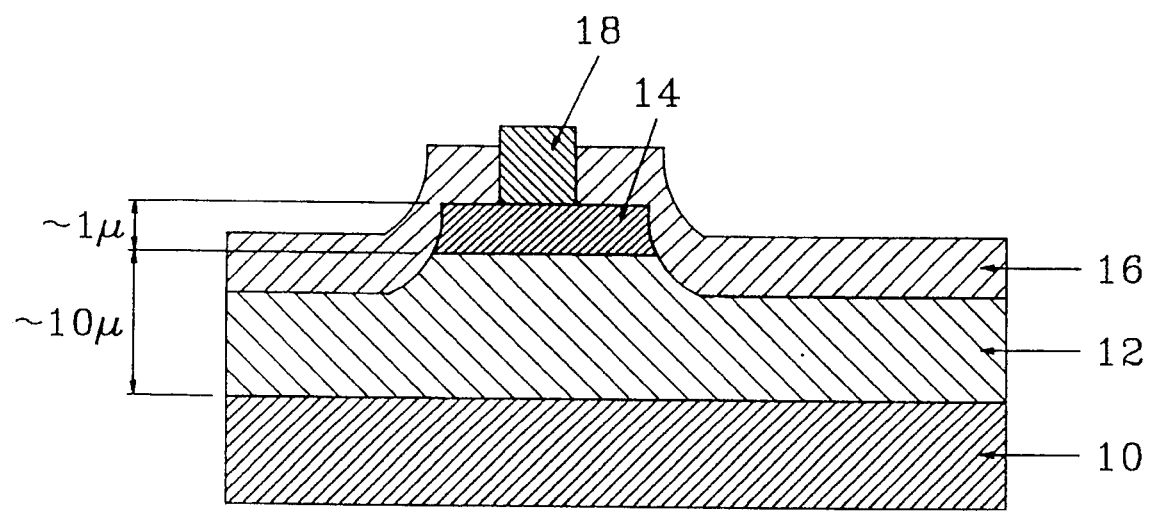
FIGS. 1a–b are prior art schematic cross-sections respectively, of a HgCdTe double layer heterojunction photodiode in a mesa configuration, and a planar configuration.
Figure 1B:
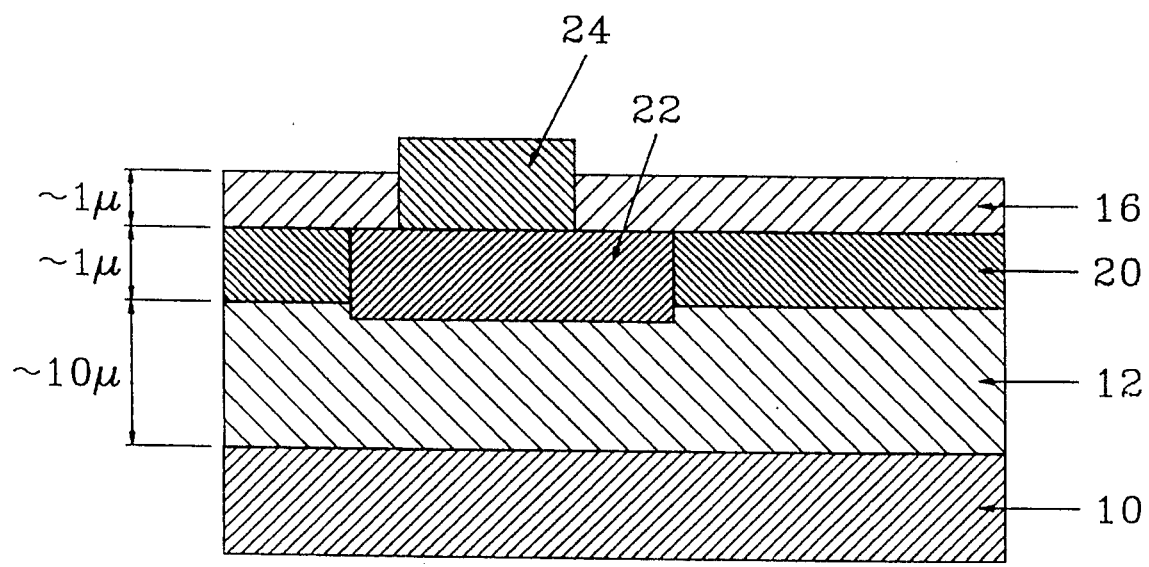

Referring now to FIGS. 1a–b, there are shown prior art schematic cross-sections respectively, of HgCdTe double layer heterojunction photodiodes. In FIG. 1a, the geometry and approximate dimensions of the double layer heterojunction photodiode is shown in a mesa configuration. This is achieved through known techniques, which are also complicated and problematic because of the mesa configuration and its characteristic shape. The technique begins with the growth on a CdZnTe substrate 10 of double layers 12, 14 of HgCdTe, having different compositions, and different dopings, namely a p-on-n heterostructure, produced by epitaxial methods. Layer 12 is an n-type $Hg_{1-x}Cd_xTe$ material (0.2<x<0.3), and layer 14 p-type, arsenic (As) doped $Hg_{1-y}Cd_yTe$ material (x<y). The mesa configuration is formed by etching the HgCdTe heterostructure, and the surface is passivated with a CdTe layer 16. An indium bump 18 is provided for connection with the photodiode.

In FIG. 1b, the geometry and approximate dimensions of the planar HgCdTe diode heterostructure is shown, featuring a double layer 12, 20 $Hg_{1-y}Cd_yTe/Hg_{1-x}Cd_xTe$ (x<y) heterostructure including two layers of HgCdTe with different compositions, and a CdTe passivation layer 16. The p-type side of the junction 22 is an As-doped $Hg_{1-y}Cd_yTe$ material (x<y) obtained by ion implantation. An ohmic contact 24 is provided. This device architecture is problematic in production, because in addition to growing the double heterostructure, the junction implementation requires ion implantation.

Figure 2A:
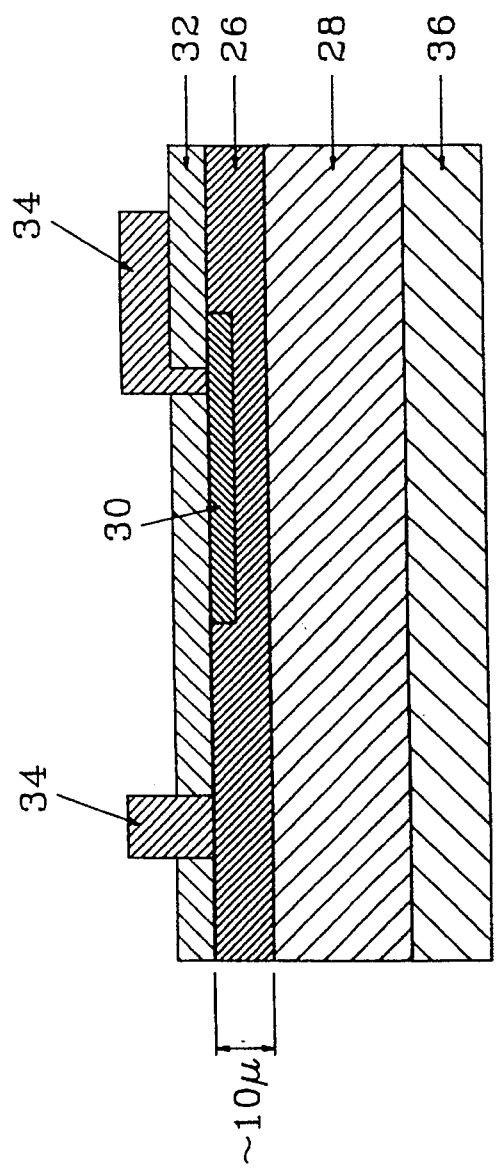
FIGS. 2a–b are schematic cross-sections, respectively, of a HgCdTe single layer p-on-n homojunction photodiode with an MOCVD CdTe heterostructure passivation, produced in accordance with the method of the present invention, using an epitaxially grown sensing material, and a bulk sensing material.
Figure 2B:
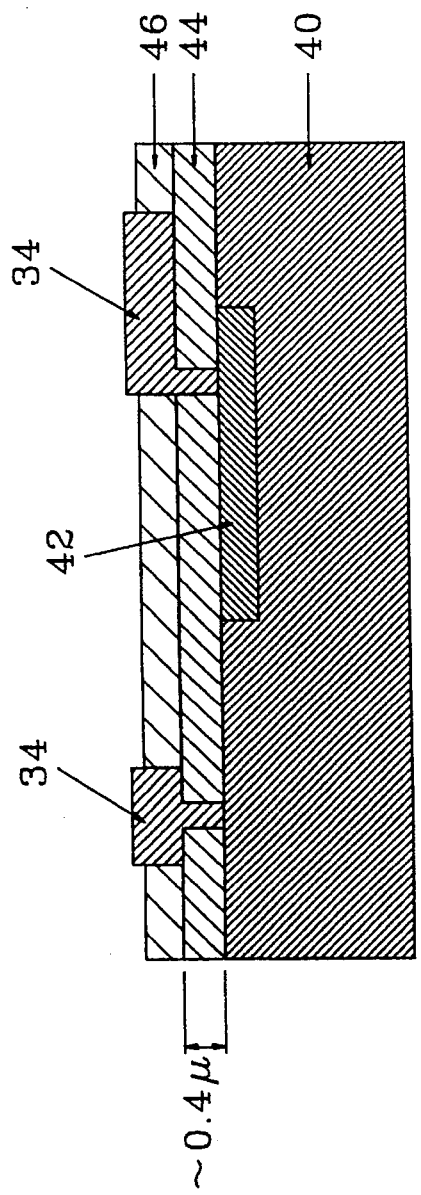
Figure 4A:
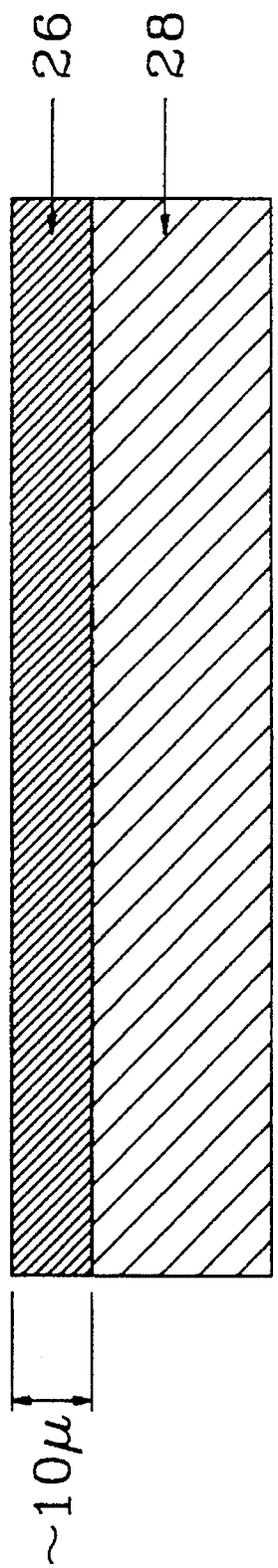
FIGS. 4a–b show schematic cross-sections of sensing material obtained, respectively, from an epitaxially grown layer and a bulk material.

FIGS. 2a–b are schematic cross-sections, respectively, of a HgCdTe single layer p-on-n homojunction photodiode with an MOCVD CdTe heterostructure passivation, produced in accordance with the method of the present invention. FIG. 2a shows the inventive photodiode fabricated with an epitaxially grown sensing material, and FIG. 2b shows the fabrication using a bulk sensing material. The geometry is planar, using a single layer of n-type HgCdTe, on which there is formed a p-on-n homojunction for sensing the infrared radiation, and a layer of MOCVD. CdTe is used for passivation. In the following description, duplicate reference numerals are used, each one associated with a particular sensing material in accordance with FIG. 4a (epitaxially grown) or 4b (bulk).

In FIG. 2a, the device architecture comprises a single layer 26 of n-type $Hg_{1-x}Cd_xTe$ material (0.2<x<0.3) on a CdZnTe substrate or alternative substrate 28. Also shown is an As-doped p-type layer 30 in material 26, and an MOCVD CdTe passivation layer 32 above the n-type and p-type layers 26, 30. A pair of metallized titanium-gold (Ti/Au) contacts 34 is applied to the n-type and p-type layers 26, 30. An anti-reflective coating 36 is also shown, for backside illumination. For front illumination, layer 36 should be above layer 32.

In FIG. 2b, the device architecture comprises a single layer 40 of bulk n-type $Hg_{1-x}Cd_xTe$ material (0.2<x<0.3). Also shown is a p-type layer 42 in material 40, and an MOCVD CdTe passivation layer 44 above the n-type and p-type layers 40, 42. An anti-reflective coating 46 is shown. A pair of metallized titanium-gold (Ti/Au) contacts 34 is applied to the n-type and p-type layers 40, 42.

The device architecture of FIG. 2a can be used with front and backside illumination, whereas the device architecture of FIG. 2b can be used with front illumination.

Figure 3A:
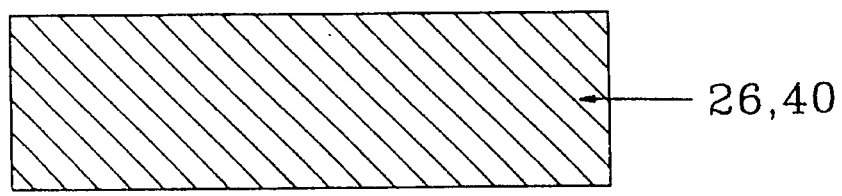
FIGS. 3a–f show schematic cross-sections of individual steps in production of the photodiodes of FIGS. 2a–b.

In FIGS. 3a–f, there are shown schematic cross-sections of a processed wafer during performance of the individual steps in production of the photodiodes of FIGS. 2a–b. In FIG. 3a, an n-type $Hg_{1-x}Cd_xTe$ material (0.2<x<0.3) layer 26, 40 (starting sensing material) is provided with the required composition and electrical properties, as follows:

Doping n: $\approx 5\times10^{14} - 5\times10^{15}$ $cm^{-3}$ at a temperature of 77K.

Electron mobility: $\mu_n > 4\times10^4$ $cm^2$ $V^{-1}$ $sec^{-1}$ at a temperature of 77K.

Excess carrier lifetime $T_p$: >0.1 μsec

Layer thickness: >10 micron.

Figure 4B:
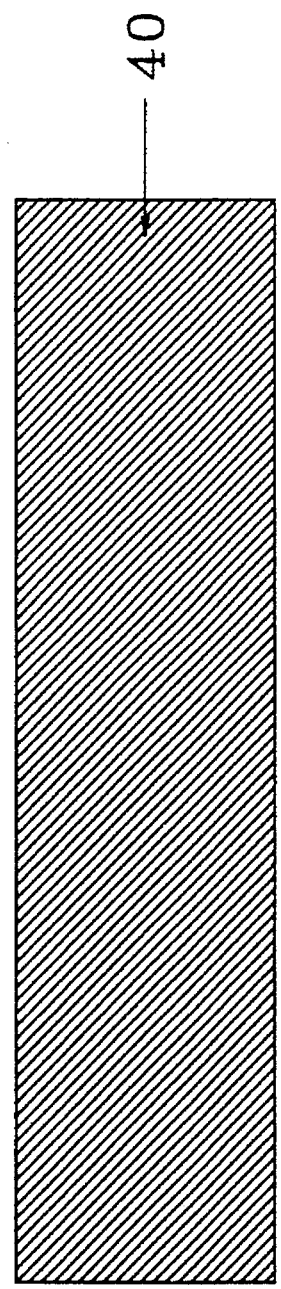

This n-type layer is a sensing material and can be obtained either as an epilayer (layer 26) grown on a substrate, such as CdZnTe or alternative substrate 28, or as a bulk material (layer 40). The starting sensing material is also shown schematically, in FIGS. 4a–b.

Figure 3B:
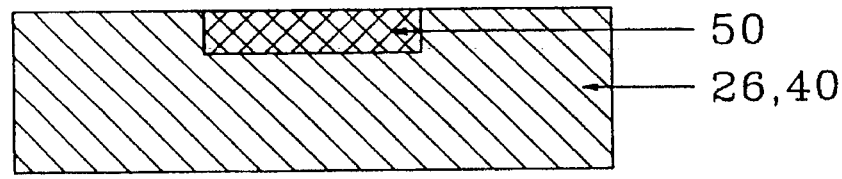

After obtaining the starting sensing material 26 or 40, ion implantation of arsenic is performed as shown in FIG. 3b, with the required dose and ion energy. The required ion dose is in the range between $1\times10^{13}$ $cm^{-2} - 1\times10^{14}$ $cm^{-2}$, and the ion energy is in the range between 50–150 KeV. This provides an arsenic-rich layer which is referred to by the numeral 50, which is not yet p-type as it has not yet been activated, and the electrical conductivity of this layer 50 is dominated by damage introduced by the ion implantation.

Figure 3C:
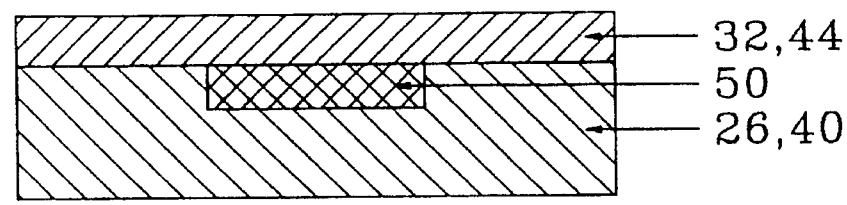
Figure 3D:
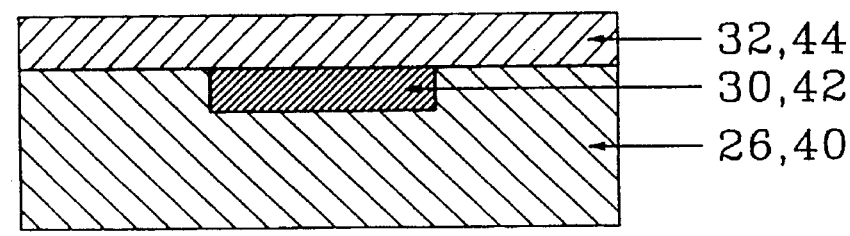

In FIGS. 3c–d, a two-stage activation and annealing process is performed. The first stage is shown in FIG. 3c, and the second stage is shown in FIG. 3d.

In FIG. 3c, the growth of the MOCVD CdTe passivation layer of a thickness of $\approx 4000$ A is shown. Typical growth temperature is in the range of $\approx 330$–430 deg. C. Prior to the growth of the passivation layer 32 or 44, the exposed surfaces of the n-type layer 26 or 40 and the implanted layer 50 are pre-treated in-situ in the MOCVD system. A typical pre-treatment method is now described. The objective of the pre-treatment method is to reduce the fixed and fast charge density at the HgCdTe interface in order to obtain a surface potential close to the flat band condition.

The processed wafer is maintained at approximately 50 deg. C. and are irradiated by a high pressure mercury UV lamp operating at 450 W, with a wide emission spectrum between 190–300 nm, for approximately 1 hour, while the MOCVD reactor and materials of FIG. 3b are flushed In hydrogen, flowing at 250 cc/min, at a total pressure of 300 Torr.

The MOCVD CdTe growth process is based on known metalorganic sources, for example, DETe (diethyltelluride) and DMCd (dimethylcadmium). Palladium-diffused hydrogen serves as the carrier gas. If the metal organic sources are DETe or DMCd, growth runs, at 430 deg. C., are performed at a subatmospheric pressure of approximately 300 Torr and the total flow rate is approximately 1.2 liter/min. The partial pressures of DETe and DMCd in the reactor are on the order of 1 Torr and 0.26 Torr, respectively. An Hg bath, which Is introduced in-situ in the MOCVD system, can be heated up to mercury boiling temperatures. The Hg bath supplies the required partial pressure of mercury to retain the n-type conductivity of the sensing material during the subsequent thermal cycles.

The processed wafer is exposed to the following temperature cycle, for example: the graphite susceptor on which the processed wafer is located, is heated to 430 deg. C. within 7 minutes. The susceptor temperature is stabilized at 430 deg. C. for an additional 5 minutes. At 430 deg. C., 0.4 µm of CdTe are grown in approximately 3 minutes. After growth, the susceptor is cooled to 260 deg. C. in 6 minutes using hydrogen (130 cc/min at 300 Torr) and after an additional 15 minutes the susceptor temperature drops below 50 deg. C. During the above temperature cycle, and the subsequent activation and annealing step (FIG. 3d), the processed wafer is exposed to a carefully controlled partial pressure of Hg vapors, to control the density of metal vacancies.

The above-described procedure can be carried out in the presence of a known metalorganic source of zinc, for example, dimethylzinc.

In FIG. 3c, simultaneously with the passivation step for growing the passivation layer 32 or 44, the arsenic-rich layer 50 is at least partially activated in the first stage, as the arsenic atoms are introduced by substitution in the tellurium sublattice structure, and ion implantation damage is annealed.

The CdTe passivation layer (32 or 44) is also a cap for the second stage of the activation and annealing process, performed at lower temperatures and for a longer period, as shown in FIG. 3d. The second anneal is performed In the range of 200–400 deg. C., for several hours, with the required partial pressure of mercury vapors. At the end of this stage, arsenic-rich layer 50 is fully activated and annealed, and forms the p-type layer (30 or 42) of the homojunction.

Figure 3E:
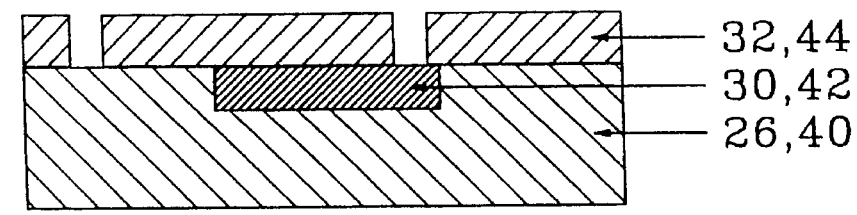
Figure 3F:
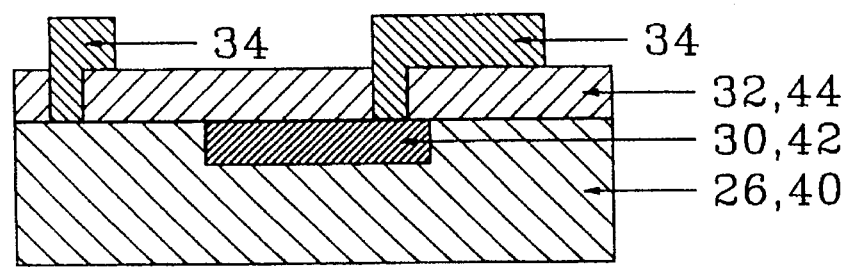

In FIG. 3e, ohmic contact openings are formed in the CdTe passivation layer 32, 44, to make electrical contact with the p-type layer and the n-type layer. Finally, a set of titanium-gold contacts 34 are metallized and patterned using known techniques as shown in FIG. 3f. Finally, an anti-reflective coating layer 36 of FIG. 2a and 46 of FIG. 2b are applied.

In summary, the present invention provides a major simplification in planar device architecture, using a single layer having a p-on-n homojunction for sensing the infrared radiation, and a CdTe or CdZnTe/HOCdTe heterostructure for passivation. This combination best integrates the benefits of each structure.

Furthermore, the inventive method allows application of different growth technologies for the sensing material and the passivation layer. This allows the sensing material to be supplied via the best available production techniques, and enables careful control of the interface properties between the passivation layer and the sensing material, while simultaneously at least partially activating the implanted arsenic-doped layer during passivation.

The inventive method reduces the number of required production steps, and includes high-quality passivation. Therefore, the production process is simplified, and can be achieved at reduced cost with increased uniformity, yield, and reproducibility, while retaining high performance.

Having described the invention with regard to certain specific methods and compositions, it is to be understood that the description is not meant as a limitation, since further modifications may now suggest themselves to those skilled in the art, and it is intended to cover such modifications as fall within the appended claims.

I claim:

1. A planar photodiode device responsive to infrared radiation, said device comprising:

an n-type HgCdTe single layer with a predetermined composition and predetermined electrical properties for sensing infrared radiation;

an arsenic-rich layer implanted on a portion of said n-type HgCdTe single layer;

at least one of a CdTe and $Cd_{1-z}Zn_zTe$ (0<z<1) passivation layer grown on said n-type HgCdTe single layer and said implanted arsenic-rich layer at an interface having a reduced fixed and fast charge density in order to obtain a surface potential close to the flat band condition, wherein growth of said passivation layer causes at least partial activation of said implanted arsenic-rich layer to form a p-on-n homojunction such that said implanted arsenic-rich layer becomes p-type, and wherein said n-type HgCdTe single layer and said implanted p-type arsenic-rich layer are annealed;

ohmic contacts connected to said implanted p-type arsenic-rich layer, and said n-type HgCdTe single layer; and an anti-reflection coating on the photodiode.

2. The device of claim 1 wherein said n-type HgCdTe single layer is provided as an epitaxially-grown layer.

3. The device of claim 1 wherein said n-type HgCdTe single layer is provided as a bulk layer.

4. The device of claim 1 wherein said n-type HgCdTe layer is provided by the composition $Hg_{1-x}Cd_xTe$ (0.2<x<0.3).

5. The device of claim 1 wherein said predetermined electrical properties of said HgCdTe layer include a doping level of $5\times10^{14} < n < 5\times10^{15}$ cm$^{-3}$ at a temperature of 77K, electron mobility: $u_n > 4\times10^4$ cm$^2$ V$^{-1}$ sec$^{-1}$ at a temperature of 77K, and an excess carrier lifetime: $T_p: > 0.1$ µsec.

6. The device of claim 1 wherein said passivation layer comprises CdTe.

7. The device of claim 1 wherein said passivation layer comprises $Cd_{1-z}Zn_zTe$ (0<z<1).

* * * * *